United States Patent
Juarez et al.

(10) Patent No.: US 8,705,237 B2
(45) Date of Patent: Apr. 22, 2014

(54) THERMALLY CONDUCTIVE AND ELECTRICALLY INSULATIVE CARD GUIDE

(75) Inventors: Joseph M. Juarez, Scottsdale, AZ (US); Mark Romero, Phoenix, AZ (US); Kevin Frey, Peoria, AZ (US); Miguel Perez, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 230 days.

(21) Appl. No.: 13/150,806

(22) Filed: Jun. 1, 2011

(65) Prior Publication Data

US 2012/0307471 A1 Dec. 6, 2012

(51) Int. Cl.
*H05K 7/20* (2006.01)

(52) U.S. Cl.
USPC ........... 361/706; 361/683; 361/684; 361/760; 361/762

(58) Field of Classification Search
USPC ................. 361/388, 748, 760, 762, 683, 684; 174/52.4
See application file for complete search history.

(56) References Cited

U.S. PATENT DOCUMENTS

| | | |
|---|---|---|
| 3,333,156 A | 7/1967 | Weisman |
| 3,680,038 A | 7/1972 | Johnson |
| 3,704,394 A | 11/1972 | Johnson |
| 3,878,438 A | 4/1975 | Weisman |
| 3,932,016 A | 1/1976 | Ammenheuser |
| 4,006,388 A | 2/1977 | Bartholomew |
| 4,080,031 A | 3/1978 | Sawford-Atkins |
| 4,675,784 A | 6/1987 | Dahlberg et al. |
| 4,903,402 A | 2/1990 | Norton et al. |
| 5,023,398 A * | 6/1991 | Mahulikar et al. ............ 174/529 |
| 5,315,155 A * | 5/1994 | O'Donnelly et al. ......... 257/711 |
| 5,334,046 A | 8/1994 | Brouillette et al. |
| 5,492,481 A | 2/1996 | Lewis |
| 5,506,751 A | 4/1996 | Chatel |
| 5,520,976 A | 5/1996 | Giannetti et al. |
| 5,754,406 A | 5/1998 | Hardt et al. |
| 5,764,484 A * | 6/1998 | Hoffman et al. ............. 361/761 |
| 5,812,374 A | 9/1998 | Shuff |
| 6,229,709 B1 | 5/2001 | Hardt et al. |
| 6,285,564 B1 | 9/2001 | O'Brien |
| 6,396,690 B1 | 5/2002 | Blatti |
| 6,765,796 B2 * | 7/2004 | Hoffman et al. ............. 361/695 |
| 6,778,398 B2 | 8/2004 | Wyland |
| 7,576,991 B2 | 8/2009 | Naritomi |
| 8,258,682 B2 * | 9/2012 | Villard ............................ 313/46 |
| 2010/0307800 A1 | 12/2010 | Wee et al. |

* cited by examiner

*Primary Examiner* — Cathy Lam
(74) *Attorney, Agent, or Firm* — Shumaker & Sieffert, P.A.

(57) ABSTRACT

A card guide may include an aluminum substrate and a hard anodized coating formed on the aluminum substrate. In some examples, the hard anodized coating may have an electrical resistance of greater than about 100,000,000 ohms. Additionally or alternatively, the hard anodized coating may have a thickness of greater than about 38.1 μm (0.015 inch).

13 Claims, 7 Drawing Sheets

A-A

A-A

THERMALLY CONDUCTIVE AND ELECTRICALLY INSULATIVE CARD GUIDE

TECHNICAL FIELD

The disclosure relates to card guides for printed boards.

BACKGROUND

Some electronic enclosures enclose a master interconnect board (MIB) and at least one printed board (PB) or printed board assembly (PBA) that is electronically coupled to the MIB. A PBA is a PB that includes at least one electronic component mounted thereto. In some examples, the electronic enclosure may include at least one card guide that aligns a PB or PBA and the MIB, and, in some cases, may physically restrain the PB or PBA relative to the MIB.

SUMMARY

In general, the disclosure is directed to a card guide that includes an aluminum substrate and a hard anodized coating formed on the aluminum substrate. In some examples, the card guide may be thermally conductive, allowing transfer of heat from a PB or PBA to the card guide. The hard anodized coating may include aluminum oxide, and may have an electrical resistance of greater than about 100,000,000 ohms. Thus, in some examples, the hard anodized coating may substantially fully electrically isolate the aluminum substrate from the PB or PBA.

In one aspect, the disclosure is directed to a card guide including an aluminum substrate and a hard anodized coating formed on the aluminum substrate. According to this aspect of the disclosure, the anodized coating may have an electrical resistance of greater than about 100,000,000 ohms.

In another aspect, the disclosure is directed to a system including an electronics enclosure comprising a card guide. According to this aspect of the disclosure, the card guides includes an aluminum substrate and a hard anodized coating formed on the aluminum substrate. In some examples, the hard anodized coating has an electrical resistance of greater than about 100,000,000 ohms. The system may additionally include a MIB and a PB. The PB may be electrically coupled to the MIB and in physical contact with the card guide, and the hard anodized coating may substantially fully electrically isolate the aluminum substrate from the PB.

In another aspect, the disclosure is directed to a method including attaching a card guide to a structure of an electronics enclosure, where the card guide comprises an aluminum substrate and a hard anodized coating formed on a surface of the aluminum substrate, and where the hard anodized coating has an electrical resistance of greater than about 100,000,000 ohms. In accordance with this aspect of the disclosure, the method further includes engaging a printed board with the card guide, and electrically connecting the printed board to a master interconnect board within the electronics enclosure.

The details of one or more examples are set forth in the accompanying drawings and the description below. Other features, objects, and advantages of the disclosure will be apparent from the description and drawings, and from the claims.

DETAILED DESCRIPTION

In general, the disclosure is directed to a card guide that includes an aluminum substrate and a hard anodized coating formed on the aluminum substrate. The hard anodized coating may include aluminum oxide, and may have an electrical resistance of greater than about 100,000,000 ohms. Hence, in some examples, the hard anodized coating may substantially fully electrically isolate the aluminum substrate from the PBA. Additionally, in some examples, the card guide may be thermally conductive, allowing transfer of heat from a PB of PBA inserted in the card guide to the card guide.

In some examples, the card guide may form a portion of a larger system, e.g., an electronics enclosure. For example, the card guide may be used in a flight data recorder, or "black box," in an airplane. Although a flight data recorder will be the primary application described herein, the card guide may be used in any electronics enclosure where a PB or PBA is guided into position and/or restrained by a card guide.

Figure 1:
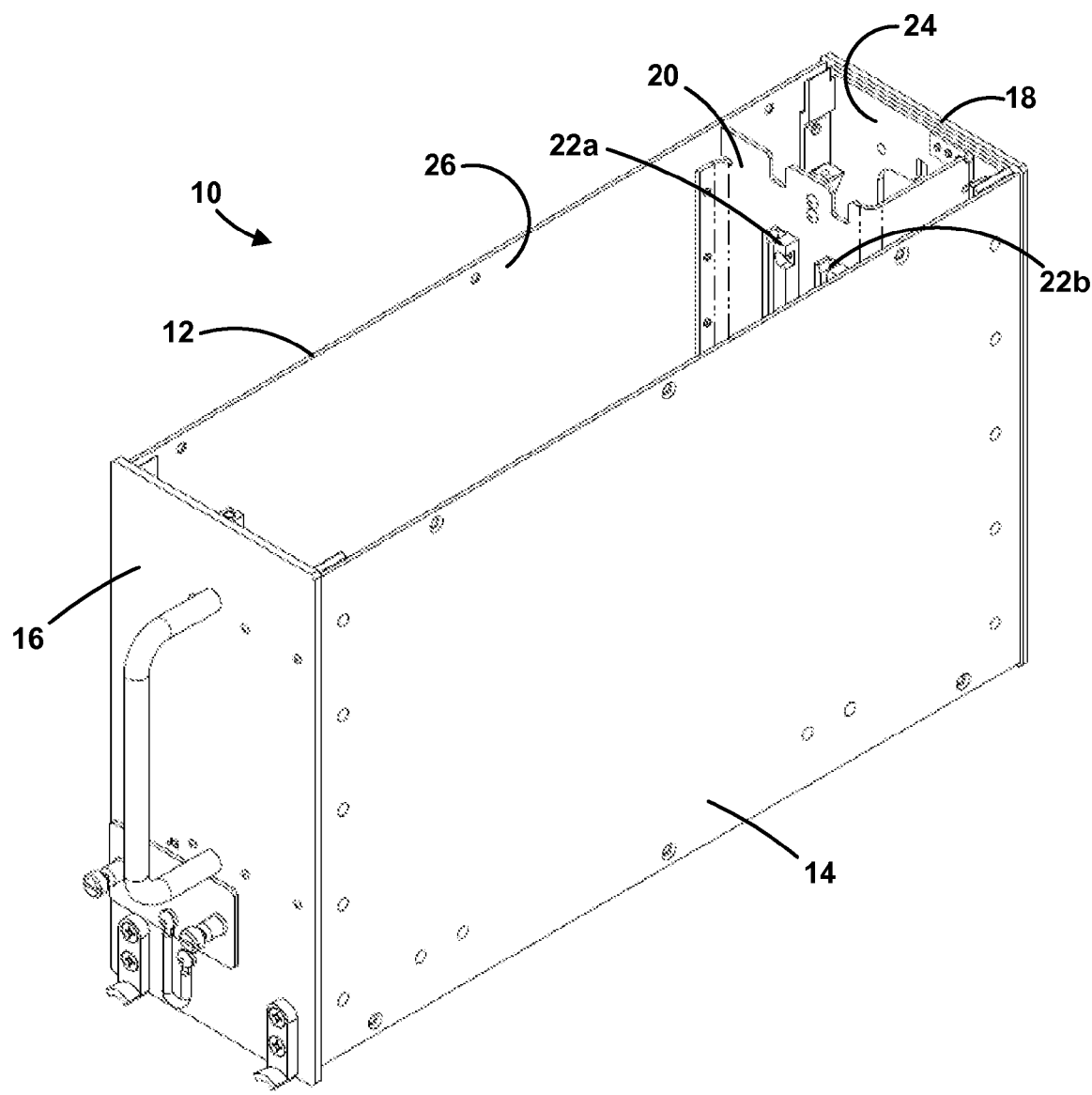
FIG. 1 is a perspective diagram illustrating an example electronics enclosure that includes a card guide in accordance with some aspects of the disclosure.
Figure 2:
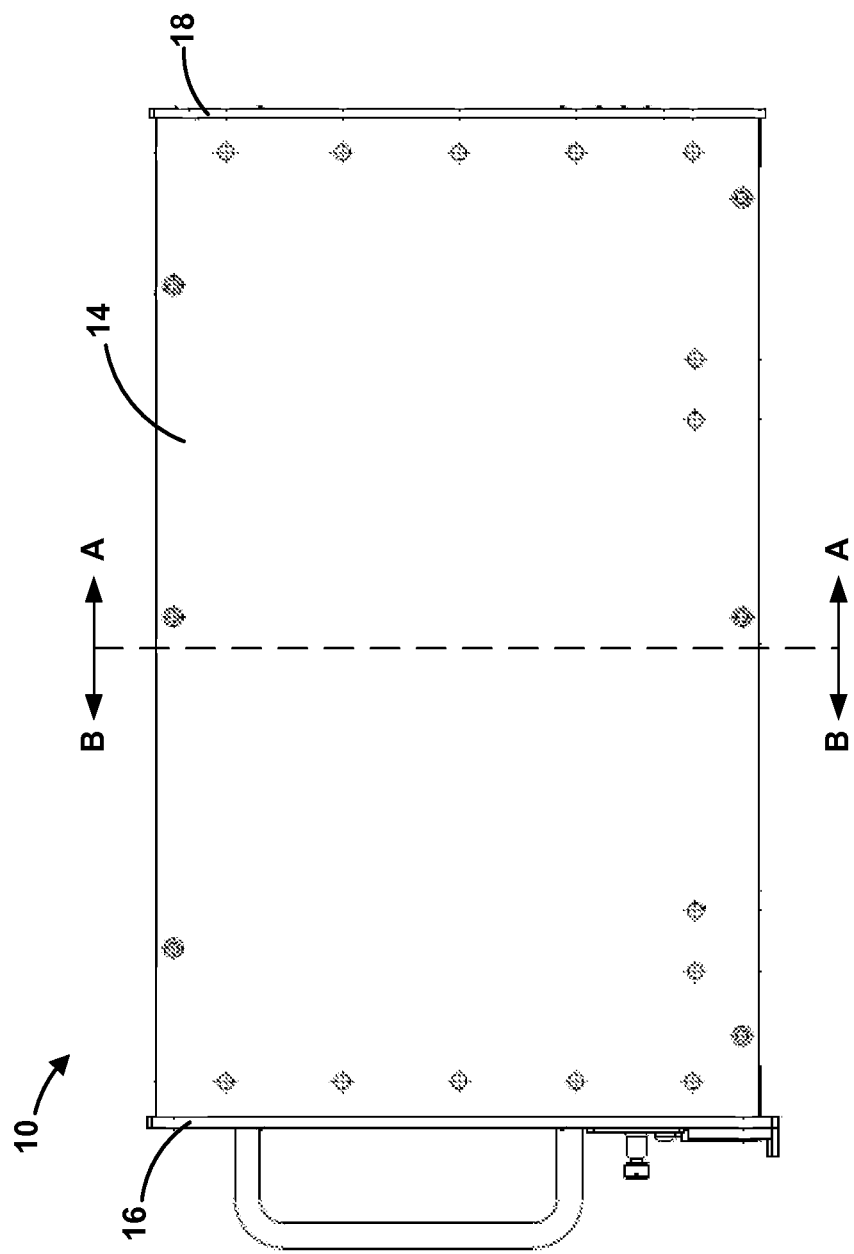
FIG. 2 is a side view of the example electronics enclosure shown in FIG. 1.
Figure 3:
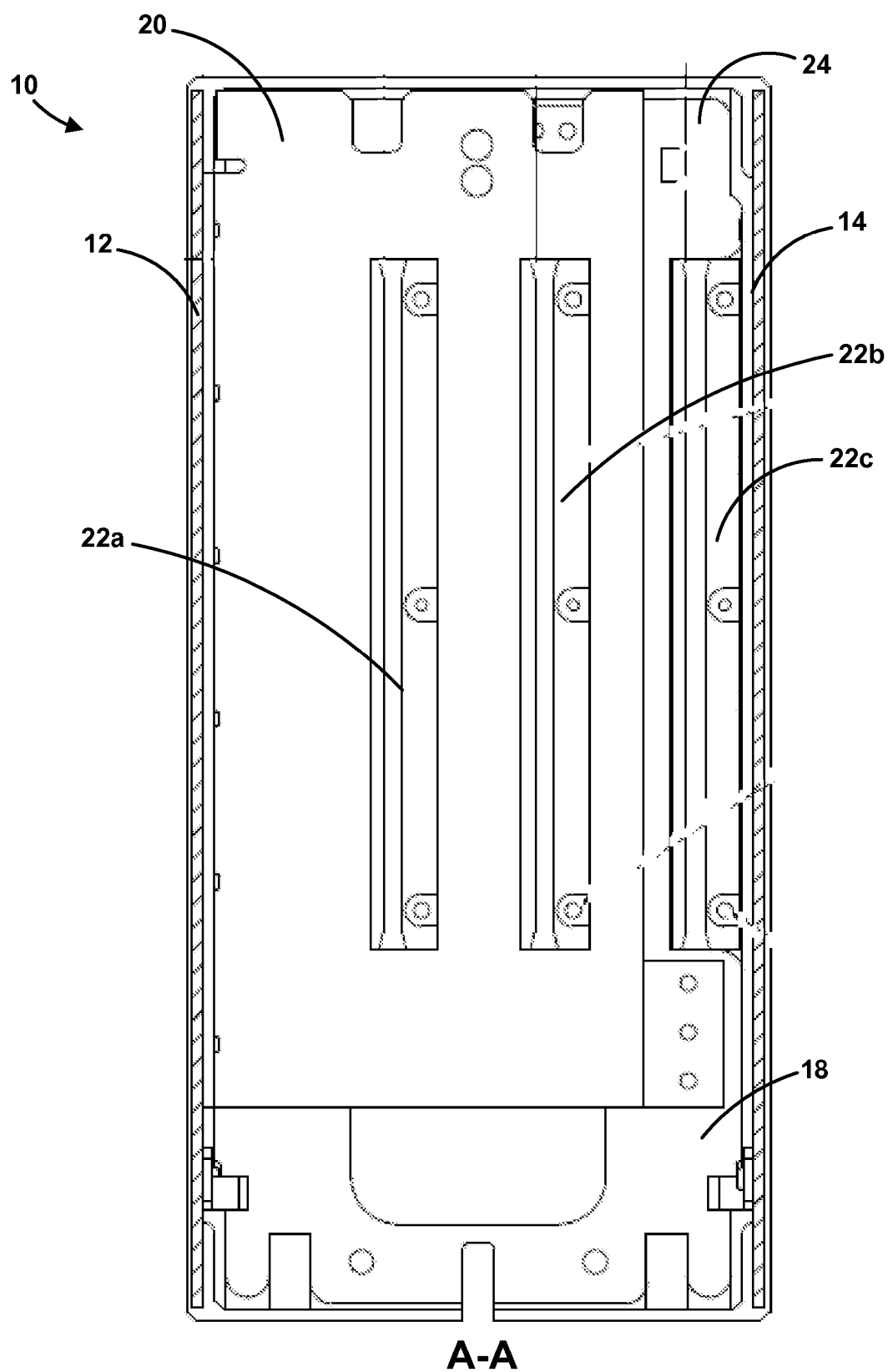
FIG. 3 is a cross-sectional diagram illustrating the example electronics enclosure along section line A-A of FIG. 2.
Figure 4:
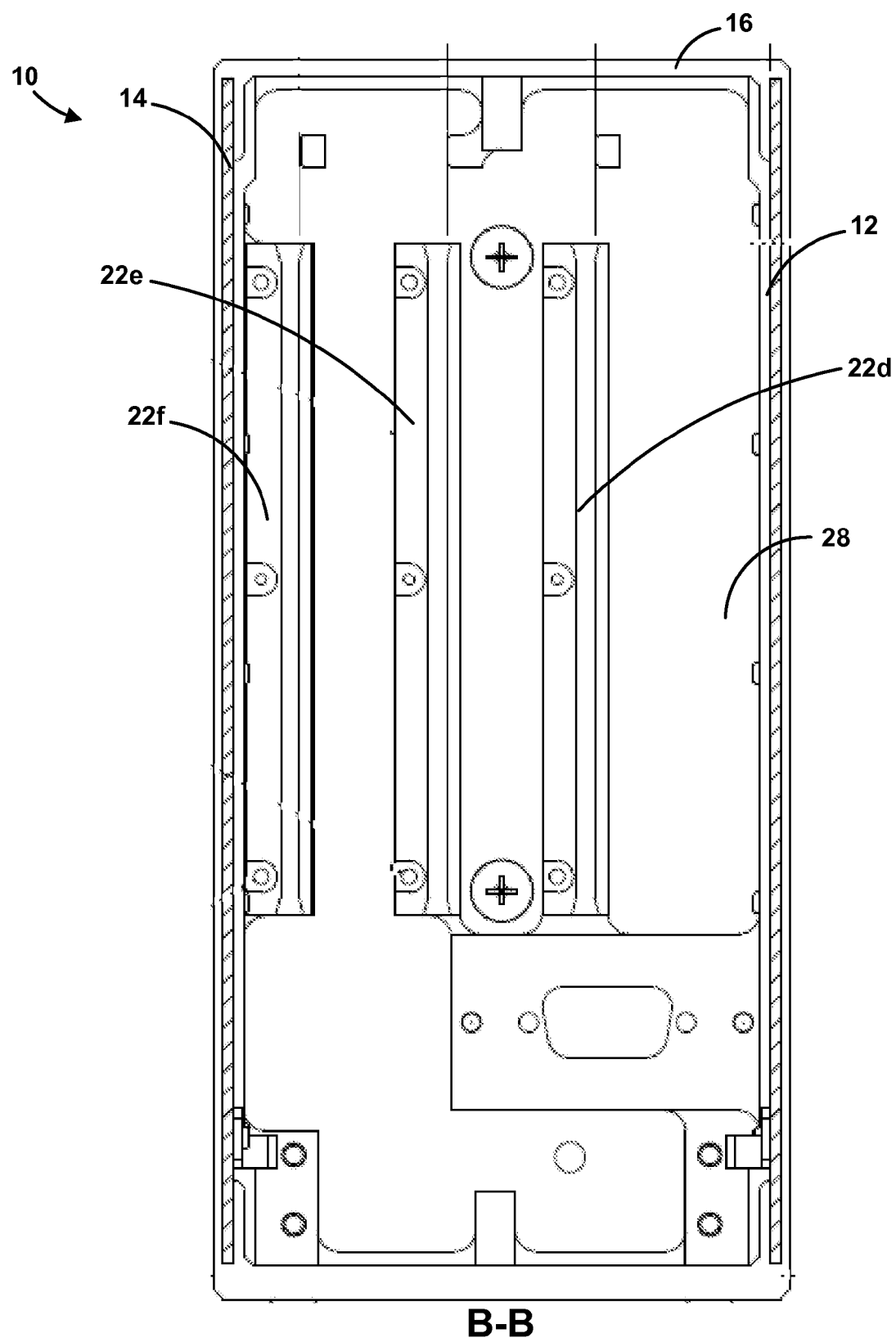
FIG. 4 is a cross-sectional diagram illustrating the example electronics enclosure along section line B-B of FIG. 2.

FIGS. 1-4 are diagrams illustrating various views of an example electronics enclosure 10, which may be a flight data recorder in some examples. FIG. 1 is a perspective diagram illustrating an example electronics enclosure 10 that includes a card guide in accordance with some aspects of the disclosure. FIG. 2 is a side view of the example electronics enclosure 10 shown in FIG. 1. FIG. 3 is a cross-sectional diagram illustrating the example electronics enclosure 10 along section line A-A of FIG. 2. FIG. 4 is a cross-sectional diagram illustrating the example electronics enclosure 10 along section line B-B of FIG. 2.

Figure 5:
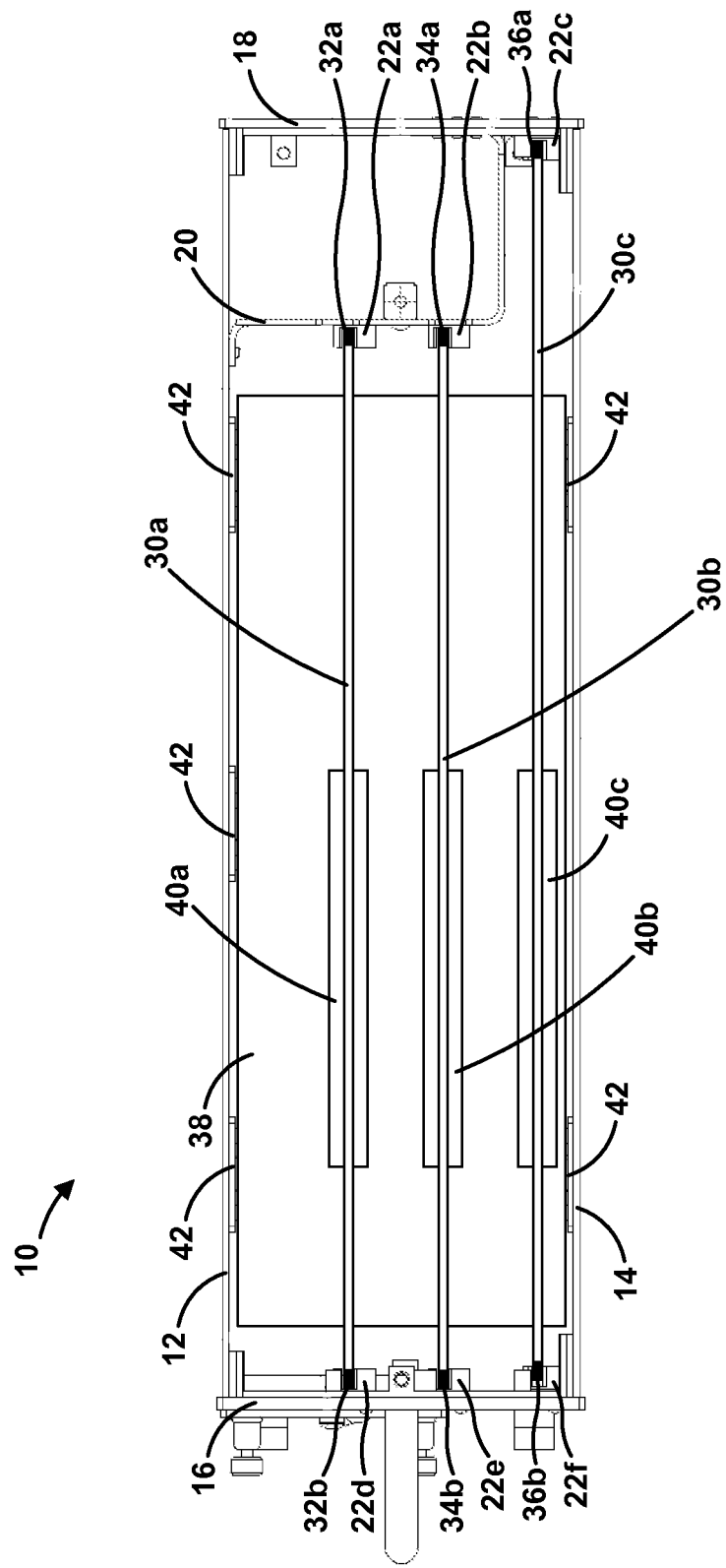
FIG. 5 is a top view of the example electronics enclosure shown in FIG. 1, and includes a MIB and PBA electrically connected to the MIB and in physical contact with the card guide.

Electronics enclosure 10 may be configured to substantially fully enclose one or more PBAs, such as PBs 30 and MIB 38 shown in FIG. 5. In some examples, electronics enclosure 10 may separate the one or more PBAs from the environment external to the electronics enclosure 10, e.g., to protect the one or more PBAs from environmental contaminants, physical damage, and/or electrical interference. In the example shown in FIGS. 1-4, electronics enclosure 10 includes a first sidewall 12 and a second sidewall 14. First and second sidewalls 12, 14 are connected at respective ends by first end wall 16 and second end wall 18. Although not shown in FIGS. 1-4, electronics enclosure 10 also include a cover and a base that substantially occupies the space between the edges of sidewalls 12, 14 and end walls 16, 18, such that when fully assembled, electronics enclosure 10 forms a substantially closed container than encloses the electronics (such as PBs 30 and MIB 38 shown in FIG. 5). In some examples, first and second sidewalls 12, 14 and first and second end walls 16,

18 may be formed of a metal, such as stainless steel, aluminum, titanium, or the like. In other examples, first and second sidewalls 12, 14 and first and second end walls 16, 18 may be formed of a composite material, such as a carbon fiber composite material. In some examples, first and second sidewalls 12, 14 and first and second end walls 16, 18 may be formed of the same material. In other examples, at least one of first and second sidewalls 12, 14 and first and second end walls 16, 18 may be formed from a different material that at least one other of first and second sidewalls 12, 14 and first and second end walls 16, 18.

Electronics enclosure 10 further includes a bracket 20 on which a first card guide 22a and a second card guide 22b are mounted. In the example illustrated in FIGS. 1-4, bracket 20 is attached to an interior surface 24 of second end wall 18 and an interior surface 26 of first sidewall 12. In other examples, bracket 20 may be attached to other structures of electronics enclosure 10, e.g., second sidewall 14 or first end wall 16. Alternatively, in some examples, electronics enclosure 10 may not include bracket 20. In examples in which electronics enclosure 10 does not include bracket 20, first card guide 22a and/or second card guide 22b may be mounted on or directly to second end wall 18 or another structure within electronics enclosure 10.

In some examples, bracket 20 may be formed of the same material as first and second sidewalls 12, 14 and/or first and second end walls 16, 18. In other examples, bracket 20 may be formed of a different material than first and second sidewalls 12, 14 and/or first and second end walls 16, 18. As examples, bracket 20 may be formed of any one or more of aluminum, stainless steel, titanium, a composite material, or the like.

As shown in FIG. 3, a third card guide 22c is mounted on interior surface 24 of second end wall 18. In some examples, instead of being mounted on second end wall 18, third card guide 22c may be mounted on bracket 20 or another structure within electronics enclosure 10.

FIG. 4 is a cross-sectional diagram taken along section B-B of FIG. 2 that illustrates a view of the interior of electronics enclosure 10 facing first end wall 16. As shown in FIG. 4, a fourth card guide 22d, fifth card guide 22e, and sixth card guide 22f may be mounted on an interior surface 28 of first end wall 16. In other examples, at least one of card guides 22d, 22e, 22f may be mounted on a different structure within electronics enclosure 10, such as a structure similar to bracket 20.

FIG. 5 is a top view of an example of electronics enclosure 10 with a MIB 38, a first PB 30a, a second PB 30b, and a third PB 30c (collectively "PBs 30") inserted within enclosure 10. MIB 38 may include one or more PBAs (e.g., each PBA including a PB with electronic and/or electrical components surface mounted or through-mounted thereon), and may include a first electrical connector 40a, a second electrical connector 40b, and a third electrical connector 40c (collectively "electrical connectors 40") for electrically connecting to PBs 30. In some examples, MIB 38 may be mounted within electronics enclosure 10 on brackets 42, as shown in FIG. 5; however, in other examples, MIB 38 may be mounted within electronics enclosure using other mechanisms. Additionally, although not shown in FIG. 5, in some examples, at least one of PBs 30 may include a PBA (e.g., may include at least one electronic and/or electrical component mounted thereon).

As shown in FIG. 5, fourth card guide 22d may be substantially aligned with first card guide 22a to form a first card guide pair configured to receive first PB 30a and substantially retain first PB 30a in place relative to MIB 38. The first card guide pair is substantially aligned with first electrical connector 40a so when first PB 30a is properly inserted in first card guide 22a and fourth card guide 22d, first PB 30a is aligned with and can electrically connect to first electrical connector 40a. Similarly, fifth card guide 22e may be substantially aligned with second card guide 22b to form a second card guide pair that is substantially aligned with second electrical connector 40b and is configured to receive a second PB 30b and substantially retain second PB 30b in place relative to MIB 38. The second card guide pair is substantially aligned with second electrical connector 40b so when second PB 30b is properly inserted in second card guide 22b and fifth card guide 22e, second PB 30b is aligned with and can electrically connect to second electrical connector 40b. Sixth card guide 22e may be substantially aligned with third card guide 22c to form a third card guide pair that is substantially aligned with third electrical connector 40c and is configured to receive a third PB 30c and substantially retain third PB 30c in place relative to MIB 38. The third card guide pair is substantially aligned with third electrical connector 40c so when third PB 30c is properly inserted in third card guide 22c and sixth card guide 22f, third PB 30c is aligned with and can electrically connect to third electrical connector 40c.

Although FIGS. 1-5 illustrate an electronics enclosure 10 that includes six card guides 22a-22f (collectively "card guides 22"), in other examples, electronics enclosure 10 may include a fewer or greater number of card guides 22. For example, electronics enclosure 10 may include two card guides 22 that are positioned to receive a PB, e.g., PB 30a, four card guides 22 that are positioned in pairs to receive two PBs 30, or eight card guides 22 in pairs that are positioned to receive four PBs 30. In some examples, at least one of card guides 22 may not be arranged or positioned in a pair with another one of card guides 22, and a single one of card guides 22 may be used to accept a PB, e.g., PB 30a. In addition, card guides 22 can be positioned on different surfaces of enclosure 10 in addition to or instead of first and second end walls 16, 18 (e.g., an additional card guide can be positioned on a cover and/or a base of enclosure 10).

In some examples, in addition to facilitating alignment of PBs 30 with electrical connectors 40, card guides 22 may also restrain movement of PBs 30 relative to card guides 22 and/or MIB 38. For example, respective card guides 22 may physically contact a respective one of PBs 30 and form a friction fit that restrains movement between the respective one of card guides 22 and the respective one of PBs 30. In some examples, card guides 22 may include a clamp, screw, clip, or other restraint mechanism that engages with PBs 30 to exert force on PBs 30 and limit movement of PBs 30 relative to card guides 22 and/or MIB 38.

In some examples, first PB 30a may include a first electrically and thermally conductive end portion 32a and a second electrically and thermally conductive end portion 32b (collectively "electrically conductive end portions 32"). In some examples, electrically and thermally conductive end portions 32 may include exposed electrically conductive planes, traces, or surfaces on or within first PB 30a. In other examples, electrically and thermally conductive end portions 32 may include a metal coating or cap that is formed on the ends of first PB 30a to contact card guides 22a, 22d.

When electrically and thermally conductive end portions 32 include a metal coating or cap, the coating or cap may facilitate engagement between first PB 30a and card guides 22a, 22d, for example, to reduce or substantially eliminate movement of first PB 30a with respect to card guides 22a, 22d. For example, the metal coating or cap may engage in a friction fit with card guides 22a, 22d. In some implementations, the metal coating or cap may allow greater force to be applied to first PB 30a to restrain first PB 30a with respect to at least one of card guides 22a, 22d without substantially affecting the performance of PB 30a compared to examples in which PB 30a does not include the metal coating or cap.

Second PB 30b also may include electrically and thermally conductive end portions 34a, 34b (collectively "electrically and thermally conductive end portions 34"), and third PB 30c may include electrically and thermally conductive end portions 36a, 36b (collectively "electrically and thermally conductive end portions 36"). Electrically and thermally conductive end portions 34, 36 may be similar to or substantially the same as electrically conductive and thermally end portions 32.

In accordance with some aspects of the disclosure card guides 22 may include an aluminum substrate and a hard anodized coating formed on the aluminum substrate. In some implementations, electrically and thermally conductive end portions 32, 34, 36 may provide a thermal pathway from PBs 30 to respective card guides 22. Because card guides 22 are attached to or mounted on other structures of electrical enclosure 10, such as first end wall 16, second end wall 18, or bracket 20, at least some heat generated by electrical components on PBs 30 may be transferred from PBs 30 to enclosure 10 (e.g., to first end wall 16, second end wall 18, and/or bracket 20) and dissipated by enclosure 10. This may facilitate cooling of PBs 30 and, in some implementations, electronic components mounted on PBs 30 (e.g., when at least one of PBs 30 comprises a PBA). Accordingly, in some examples, card guides 22 may include a material having a relatively high thermal conductivity to facilitate transfer of heat from PBs 30 to enclosure 10 (e.g., to first end wall 16, second end wall 18, and/or bracket 20).

Additionally, in some examples, PBs 30 may be electrically isolated from card guides 22 and the components on which card guides 22 are mounted, such as first end wall 16, second end wall 18, and/or bracket 20. This configuration may help prevent undesirable electrical connections from being made, such as by preventing unwanted electrical signals from being conducted from one PB 30 to another through first end wall 16, second end wall 18, and/or bracket 20 to PBs 30, or vice versa.

Card guides 22 that include an aluminum substrate and a hard anodized coating formed on the aluminum substrate may be both thermally conductive and electrically isolating. Additionally, in some examples, card guides 22 comprising hard anodized aluminum substrates may be at least one of robust, strong, or light, which may be desirable in applications such as a flight data recorder.

Card guides 22 may include an aluminum substrate. The aluminum substrate may comprise or consist essentially of elemental aluminum or an aluminum alloy. In some examples, the aluminum substrate may be substantially chemically homogeneous, e.g., may have substantially the same chemical composition throughout the substrate. In some examples, the aluminum substrate may be essentially free of plastic, ceramic, or composite material. For example, in some implementations, the aluminum substrate may not include a ceramic or plastic phases mixed or interspersed with aluminum or aluminum alloy phases.

In some examples, the substrate of card guides 22 may include, for example, 6061 aluminum alloy or 7075 aluminum alloy. In some implementations, 6061 aluminum alloy may include between about 0.4 weight percent (wt. %) and about 0.8 wt. % silicon, up to about 0.7 wt. % iron, between about 0.15 wt. % and about 0.40 wt. % copper, up to about 0.15 wt. % manganese, between about 0.8 wt. % and about 1.2 wt. % magnesium, between about 0.04 wt. % and about 0.35 wt. % chromium, up to about 0.25 wt. % zinc, up to about 0.15 wt. % titanium, and a balance aluminum. In some implementations, 7075 aluminum alloy may include up to about 0.4 wt. % silicon, up to about 0.5 wt. % iron, between about 1.2 wt. % and about 2.0 wt. % copper, up to about 0.30 wt. % manganese, between about 2.1 wt. % and about 2.9 wt. % magnesium, between about 0.18 wt. % and about 0.28 wt. % chromium, between about 5.1 wt. % and about 6.1 wt. % zinc, up to about 0.2 wt. % titanium, and a balance aluminum.

The hard anodized coating may include aluminum oxide, and may be formed on one or more surfaces of the aluminum substrate. For example, the hard anodized coating may be formed at least on surfaces of the aluminum substrate that contact one of PBs 30. In other examples, the hard anodized coating may be formed on substantially all surfaces of card guides 22.

The hard anodized coating may have a thickness sufficient to provide an electrical resistance that substantially fully electrically isolates the aluminum substrate of the respective one of card guides 22 from the respective one of PBs 30 that is engaged with the card guide. For example, in some examples, the hard anodized coating may be sufficiently thick to provide an electrical resistance across the coating of at least 100,000,000 ohms. In some examples, the hard anodized coating may define a thickness of at least 38.1 μm (0.0015 inch) in a direction substantially normal to the surface of the aluminum substrate on which the coating is formed. In other examples, the hard anodized coating may define a thickness of between about 38.1 μm (0.0015 inch) and about 63.5 μm (0.0025 inch), or may define a thickness of about 50.8 μm (0.0020 inch). In some examples, the thickness of the hard anodized coating may be determined using ASTM B244 (Eddy Current Method) or ASTM E376 (Magnetic-Field or Eddy Current (Electromagnetic) Method).

In some examples, the hard anodized coating may be formed to meet the requirements MIL-A-8625, Type III.

Figure 6:
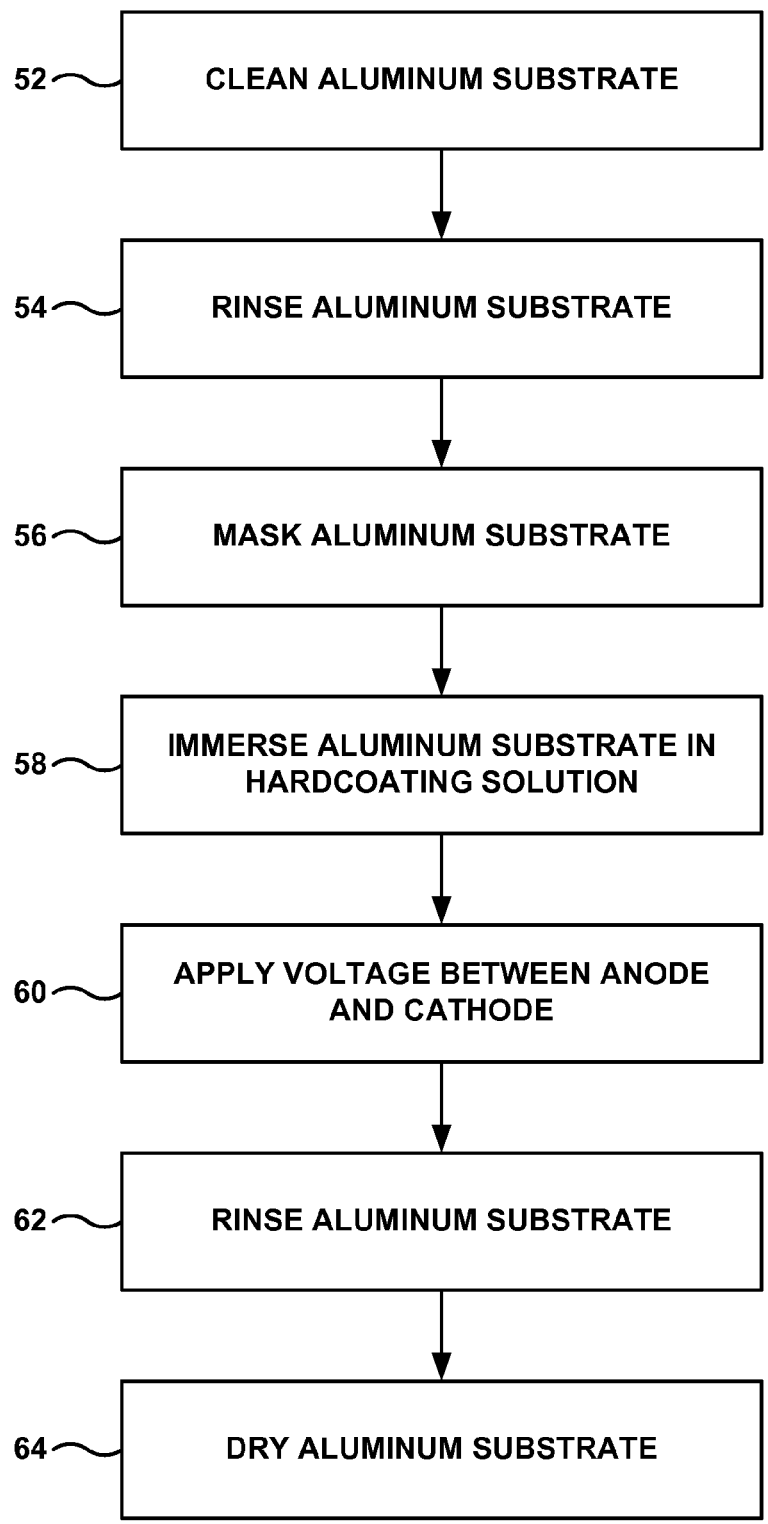
FIG. 6 is a flow diagram that illustrates an example technique that may be used to form a hard anodized coating on an aluminum substrate for use as a card guide in accordance with aspects of the disclosure.

FIG. 6 is a flow diagram that illustrates an example technique that may be used to form a hard anodized coating on an aluminum substrate for use as a card guide in accordance with aspects of the disclosure. The technique may optionally include cleaning the aluminum substrate (52). In some examples, the aluminum substrate may be cleaned by immersing the aluminum substrate in an alkaline cleaner for about 5 minutes or until clean. Example alkaline cleaners include AquaKlean EF 105 MF, available from NuGeneration Technologies, L.L.C., Rohnert Park, Calif., and Oakite® 61-B, available from Chemetall Americas, New Providence, N.J. AquaKlean EF 105 MF is a non-silicated, non-nitrated multi-metal cleaner, which includes less than 5% ethylene glycol monobutyl ether, less than 5% nonionic surfactant blend, and less than 5% anionic surfactant. Additionally and optionally, in some examples, cleaning the aluminum substrate (52) may include vapor degreasing the substrate. Once the aluminum substrate has been cleaned (52), the aluminum substrate may be rinsed, for example, in cold water, to remove the cleaning substance (54).

Optionally, the technique may include masking the aluminum substrate (56). Masking may be used to prevent deposition of the hard anodized coating on the masked portions of the aluminum substrate. The aluminum substrate may be masked using various agents, such as rubber plugs; a vinyl tape, such as that available from 3M™ under the trade designation Vinyl Tape 471; or the like. In some examples, the aluminum substrate may not be masked, and the hard anodized coating may be applied to substantially all of the aluminum substrate.

After the aluminum substrate has been rinsed (54) and, optionally, masked (56), the aluminum substrate may be immersed in a hard anodized coating solution (58). In some examples, the hard anodized coating solution may include between about 130 grams per liter (g/L) and about 140 g/L sulphuric acid and between about 13 g/L and about 15 g/L oxalic acid. The hard anodized coating solution may be disposed in a rubber or laminated steel tank in some examples. In addition, in examples, the tank may be equipped with temperature controls and a cooling system to maintain an average temperature of the hard anodized coating solution between about 3° C. (about 38° F.) and about 11° C. (about 52° F.). Additionally, in some examples, the tank may be provided with an agitator to agitate the hard anodized coating solution. Agitating the hard anodized coating solution may help improve chemical homogeneity of the solution and may reduce or substantially prevent local fluctuations of temperature.

The aluminum substrate may be electrically coupled to an anode while immersed in the hard anodized coating solution (58). In some examples, the anode may be a rod from which the aluminum substrate is suspended. In some examples, as the aluminum substrate is lowered into the hard anodized coating solution, no or minimal voltage may be applied to the aluminum substrate via the anode.

Once the aluminum substrate has been electrically connected to the anode and immersed in the hard anodized coating solution (58), a voltage may be applied between the anode and a cathode suspended in the hard anodized coating solution (60). In some examples, the voltage may be increased gradually over a period of time, such as about 15 minutes, until a predetermined current density is achieved. In some examples, the predetermined current density may be about 118 amps per square meter (about 36 amps per square foot). In some implementations, once the current density has reached the predetermined value, the coating process may continue for about 40 minutes (e.g., for a hard anodized coating with a nominal thickness of about 50.8 µm (about 0.002 inch)). The approximate voltages necessary to produce a particular current density may change during the coating process, for example, as the composition of the hard anodized coating solution changes. In some examples, the applied voltage may range between about 23 volts and about 51 volts. The particular voltage or voltage range used may depend, at least in part, on the composition of the aluminum substrate, e.g., whether the aluminum substrate is elemental aluminum or an aluminum alloy, or the particular composition of the aluminum alloy.

Once the hard anodized coating has been formed to a predetermined thickness, the coated aluminum substrate may be rinsed (62), e.g., with cold water, and subsequently dried (64).

Figure 7:
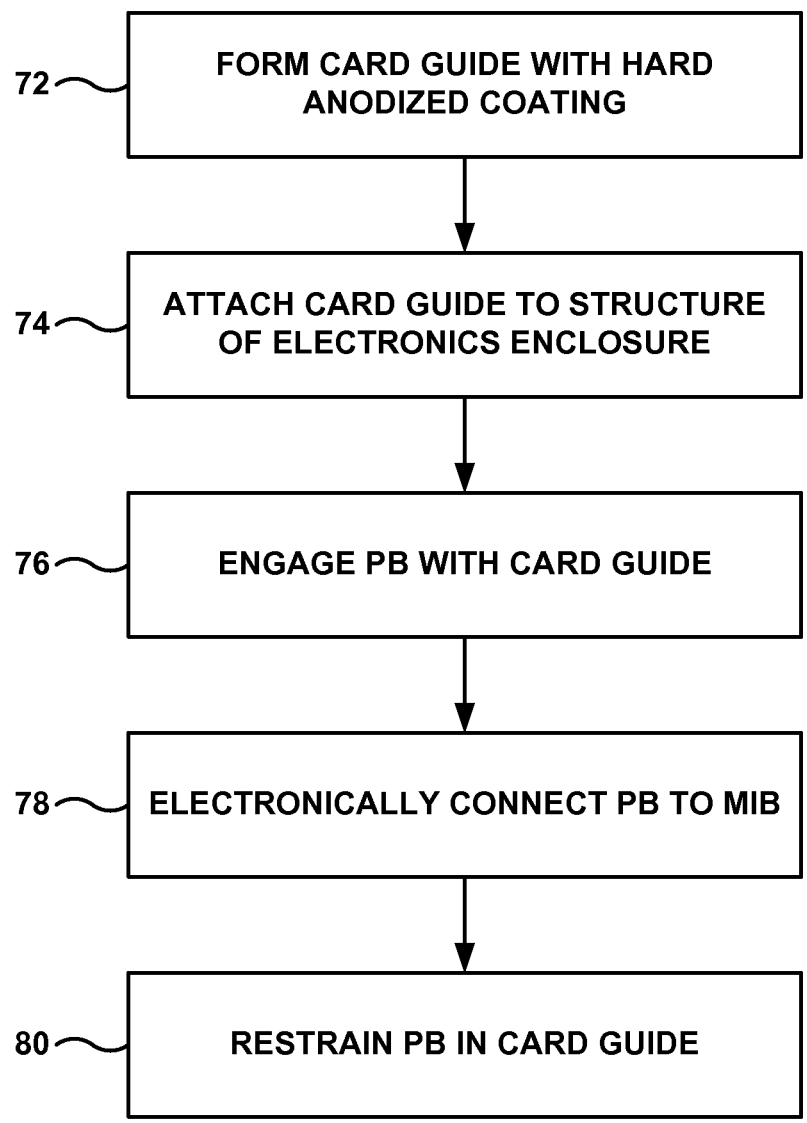
FIG. 7 is a flow diagram of an example technique for assembling an electronics enclosure including at least one card guide comprising an aluminum substrate and a hard anodized coating.

FIG. 7 is a flow diagram of an example technique for assembling an electronics enclosure including at least one card guide comprising an aluminum substrate and a hard anodized coating. The technique may optionally include forming card guides 22 that includes an aluminum substrate and a hard anodized coating (72). One example by which card guides 22 may be formed is described and illustrated in FIG. 6; however, other techniques may be used to form card guides 22. Additionally, in some examples, the technique may not include forming card guides 22 (72), and the technique shown in FIG. 7 may be performed with existing card guides 22 that include an aluminum substrate and a hard anodized coating.

Card guides 22 may be attached to a structure of electronics enclosure 10 (74), such as bracket 20, interior surface 24 of second end wall 18, interior surface 28 of first end wall 16, or the like. In some examples, card guides 22 may be welded, adhered riveted, or otherwise attached to the structure of electronics enclosure 10.

One or more PBs 30 may be engaged with at a respective one or more of card guides 22 (76). For example, card guides 22 may each define a channel that is configured (e.g., sized and/or shaped) to receive an end or edge of a respective one of PBs 30. The one or more PBs 30 may be slid into and along the channel of one or more card guides 22, such that the ends of the PB are substantially engaged with and retained in the one or more channels of the respective card guides.

The one or more PBs 30 may be electrically connected to MIB 38 (FIG. 5), e.g., via a respective one or more electrical connectors 40 (FIG. 5) (78). In some examples, the electrical connectors 40 may comprise a female electrical connector into which a male electrical connector of a respective one of PBs 30 slots. In some examples, electrical connectors 40 may include a clip or other restraint feature that engages the respective one of PBs 30 when the PB is substantially fully engaged with the respective one of electrical connectors 40. This may facilitate electrical connection between the respective one of PBs 30 and the respective one of electrical connectors 40, and may also restrain the PB relative to the electrical connector.

In some examples, the technique further includes restraining the PBs 30 relative to the respective card guides 22 (80). For example, as described above, at least some of the respective card guides 22 may include a restraint mechanism, such as a clamp, screw, clip, or the like, which engages with a respective one of PBs 30 to restrain movement of the PB relative to the card guide.

The card guides 22 described herein may include an aluminum or aluminum alloy substrate and a hard anodized coating formed on the substrate. In some examples, card guide 22 may be electrically isolated by the hard anodized coating from a PB 30 engaged with the card guide 22, while being in thermal contact with the PB 30. In this way, the card guide 22 may provide a thermally conductive pathway to help guide heat away from PB 30 and help contribute to heat dissipation from PB 30 while substantially fully electrically isolating card guide 22 from PB 30.

Various examples have been described. These and other examples are within the scope of the following claims.

The invention claimed is:

1. A system comprising:
   a printed board (PB);
   a master interconnect board (MIB); and
   a card guide comprising an aluminum substrate and a hard anodized coating formed on the aluminum substrate, wherein the hard anodized coating has an electrical resistance of greater than about 100,000,000 ohms, wherein the card guide defines a channel that is configured to receive an end of the PB and facilitate alignment of the PB with an electrical connector of the MIB, wherein the PB is electrically coupled to the MIB via the electrical connector and in physical contact with the card guide, and wherein the hard anodized coating substantially fully electrically isolates the aluminum substrate from the PB when the PB is electrically coupled to the MIB.

2. The system of claim 1, wherein the aluminum substrate comprises a substantially homogeneous chemical composition.

3. The system of claim 1, wherein the aluminum substrate consists essentially of aluminum or an aluminum alloy.

4. The system of claim 1, wherein the hard anodized coating comprises aluminum oxide.

5. The system of claim 1, wherein the hard anodized coating defines a thickness of greater than about 38.1 μm.

6. The system of claim 5, wherein the hard anodized coating defines a thickness between about 38.1 μm and 63.5 μm.

7. The system of claim 5, wherein the hard anodized coating defines a thickness of about 50.8 μm.

8. The system of claim 1, wherein the PB comprises an electrically conductive surface in physical contact with the card guide.

9. The system of claim 1, wherein the PB is thermally coupled to the card guide.

10. A method comprising:
   attaching a card guide to a structure of an electronics enclosure, wherein the card guide comprises an aluminum substrate and a hard anodized coating formed on a surface of the aluminum substrate, wherein the hard anodized coating has an electrical resistance of greater than about 100,000,000 ohms, and wherein the card guide defines a channel that is configured to receive an end of a printed board (PB) and facilitate alignment of the PB with an electrical connector of a master interconnect board (MIB);
   engaging an end of the PB with the card guide; and
   electrically coupling the PB to the MIB within the electronics enclosure via the electrical connector, wherein the PB is in physical contact with the card guide and the hard anodized coating substantially fully electrically isolates the aluminum substrate from the PB when the PB is electrically coupled to the MIB.

11. The method of claim 10, further comprising:
   forming the hard anodized coating on the aluminum substrate, wherein the hard anodized coating defines a thickness between about 38.1 μm and about 63.5 μm.

12. The method of claim 10, further comprising:
   restraining the printed board with respect to the card guide.

13. The method of claim 10, wherein engaging the printed board with the card guide comprises engaging an electrically and thermally conductive surface of the printed board with the card guide.

* * * * *